(12) United States Patent
Shibata et al.

(10) Patent No.: US 9,082,884 B2
(45) Date of Patent: Jul. 14, 2015

(54) SCHOTTKY DIODE

(71) Applicant: PANASONIC CORPORATION, Osaka (JP)

(72) Inventors: Daisuke Shibata, Kyoto (JP); Yoshiharu Anda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/059,379

(22) Filed: Oct. 21, 2013

(65) Prior Publication Data
US 2014/0042457 A1  Feb. 13, 2014

Related U.S. Application Data

(63) Continuation of application No. PCT/JP2012/002887, filed on Apr. 26, 2012.

(30) Foreign Application Priority Data

May 20, 2011   (JP) ................................ 2011-113382

(51) Int. Cl.
| | |
|---|---|
| H01L 29/66 | (2006.01) |
| H01L 21/338 | (2006.01) |
| H01L 29/872 | (2006.01) |
| H01L 29/08 | (2006.01) |
| H01L 29/47 | (2006.01) |
| H01L 29/15 | (2006.01) |
| H01L 29/20 | (2006.01) |
| H01L 29/205 | (2006.01) |

(52) U.S. Cl.
CPC .............. *H01L 29/872* (2013.01); *H01L 29/08* (2013.01); *H01L 29/475* (2013.01); *H01L 29/152* (2013.01); *H01L 29/2003* (2013.01); *H01L 29/205* (2013.01)

(58) Field of Classification Search
CPC ...................................................... H01L 29/872
USPC ................... 257/109, 280, 472; 438/172, 572
See application file for complete search history.

(56) References Cited

U.S. PATENT DOCUMENTS

7,812,371 B2 * 10/2010 Kaya et al. .................... 257/192
7,898,002 B2 *  3/2011 Hikita et al. .................. 257/192
(Continued)

FOREIGN PATENT DOCUMENTS

| JP | 2009-076866 A | 4/2009 |
|---|---|---|
| WO | 2011/010419 A1 | 1/2011 |

OTHER PUBLICATIONS

International Search Report issued in International Application No. PCT/JP2012/002887 with Date of mailing Jul. 31, 2012.

*Primary Examiner* — Calvin Lee
(74) *Attorney, Agent, or Firm* — McDermott Will & Emery LLP

(57) ABSTRACT

A Schottky diode has: a semiconductor layer stack including a GaN layer formed over a substrate and an AlGaN layer formed on the GaN layer and having a wider bandgap than the GaN layer; an anode electrode and a cathode electrode which are formed at an interval therebetween on the semiconductor layer stack; and a block layer formed in a region between the anode electrode and the cathode electrode so as to contact the AlGaN layer. A part of the anode electrode is formed on the block layer so as not to contact the surface of the AlGaN layer. The barrier height between the anode electrode and the block layer is greater than that between the anode electrode and the AlGaN layer.

5 Claims, 5 Drawing Sheets

(56) References Cited

U.S. PATENT DOCUMENTS

| | | |
|---|---|---|
| 2006/0197175 A1 | 9/2006 | Yanagihara et al. |
| 2010/0059761 A1 | 3/2010 | Horii et al. |
| 2010/0244045 A1 | 9/2010 | Yanagihara et al. |
| 2012/0146093 A1 | 6/2012 | Shibata et al. |

* cited by examiner

SCHOTTKY DIODE

CROSS-REFERENCE TO RELATED APPLICATION

This is a continuation of PCT International Application PCT/JP2012/002887 filed on Apr. 26, 2012, which claims priority to Japanese Patent Application No. 2011-113382 filed on May 20, 2011. The disclosures of these applications including the specifications, the drawings, and the claims are hereby incorporated by reference in their entirety.

BACKGROUND

The present invention relates to Schottky diodes that can be applied to, e.g., power devices.

Group III nitride semiconductors represented by gallium nitride (GaN) are wide-gap semiconductors having a wide bandgap. For example, GaN and aluminum nitride (AlN) have a bandgap as wide as 3.4 eV and 6.2 eV at room temperature, respectively. Nitride semiconductors are therefore characterized by their higher breakdown field and higher saturated electron drift velocity than those of other compound semiconductors such as gallium arsenide (GaAs), silicon (Si) semiconductors, etc.

In an AlGaN/GaN heterostructure, charges are generated on a (0001)-plane heterointerface by spontaneous polarization and piezoelectric polarization, and a sheet carrier concentration of $1 \times 10^{13}$ $cm^{-2}$ or more is obtained even in an undoped state. A higher current density diode or hetero-junction field effect transistor (HFET) can therefore be implemented by using a two-dimensional electron gas (2DEG) at a heterointerface. Accordingly, power devices using such nitride semiconductors that are advantageous for implementing higher output and higher breakdown voltage are actively being studied and developed.

For example, the general formula "AlGaN" represents a three-element alloy crystal "$Al_xGa_{1-x}N$" (where $0 \le x \le 1$). Similarly, a multi-element alloy crystal is simply represented by a sequence of chemical symbols for constituent elements, such as AlInN or GaInN. For example, a nitride semiconductor "$Al_xGa_{1-x-y}In_yN$" (where $0 \le x \le 1$ and $0 \le y \le 1$) is simply represented by AlGaInN.

Schottky diodes are one of the diodes used as power devices. Regarding GaN-based diodes, Schottky diodes using an AlGaN/GaN heterostructure are being developed. GaN-based Schottky diodes are capable of operating with a high current and low resistance because they use as a channel a two-dimensional electron gas layer that is produced at the interface between an undoped AlGaN layer and an undoped GaN layer.

Typically, the Schottky diodes have better switching characteristics but have a greater reverse leakage current as compared to PN diodes. Normally, a passivation film is formed on the device surface as a surface protection film. The passivation film is capable of suppressing surface level formation and reducing a decrease in forward current called current collapse. Since the passivation film further functions to prevent impurities from entering the device, it is essential even in terms of reliability to form a passivation film on the device surface.

Japanese Patent Publication No. 2009-076866 describes a Schottky barrier diode having an increased reverse breakdown voltage.

SUMMARY

However, the inventors of the present application found that forming a passivation film in a GaN-based Schottky diode significantly increases a reverse leakage current in the Schottky diode. This phenomenon occurs due to formation of a leakage path at the interface between the passivation film and undoped aluminum gallium nitride (i-AlGaN).

Reducing a reverse leakage current is the issue for Schottky diodes having an AlGaN/GaN heterostructure. In particular, reducing a leakage current after formation of the passivation film is a significant challenge.

In view of the above problems, it is an object of the present invention to reduce a reverse leakage current without increasing a rising voltage in a Schottky diode comprised of a nitride semiconductor.

In order to achieve the above object, according to the present invention, a Schottky diode comprised of a nitride semiconductor is configured so that a block layer is interposed between an anode and a surface of an i-AlGaN layer.

Specifically, a first Schottky diode according to the present invention includes: a substrate; a semiconductor layer stack including a first nitride semiconductor layer formed over the substrate and a second nitride semiconductor layer formed on the first nitride semiconductor layer and having a wider bandgap than the first nitride semiconductor layer; an anode electrode and a cathode electrode which are formed at an interval therebetween on the semiconductor layer stack; and a block layer formed in a region between the anode electrode and the cathode electrode so as to contact the second nitride semiconductor layer, wherein a part of the anode electrode is formed on the block layer so as not to contact a surface of the second nitride semiconductor layer, and a barrier height (potential barrier height, the same applies to the following description) between the anode electrode and the block layer is greater than that between the anode electrode and the second nitride semiconductor layer.

The first Schottky diode of the present invention includes the block layer formed in the region between the anode electrode and the cathode electrode so as to contact the second nitride semiconductor layer, and a part of the anode electrode is formed on the block layer so as not to contact the surface of the second nitride semiconductor layer. The barrier height between the anode electrode and the block layer is greater than that between the anode electrode and the second nitride semiconductor layer. With this configuration, the block layer serves as a block layer for an interface leakage current. Accordingly, a reverse leakage current can be suppressed even if a passivation film is formed on the semiconductor layer stack and each electrode.

In the first Schottky diode of the present invention, the semiconductor layer stack may include multiple ones of the first nitride semiconductor layer and multiple ones of the second nitride semiconductor layer, and the first nitride semiconductor layers and the second nitride semiconductor layers may be alternately stacked.

In this case, a multichannel structure is formed by the first nitride semiconductor layers and the second nitride semiconductor layers, which can increase a forward current. Accordingly, a Schottky diode having low resistance and a significantly reduced reverse leakage current can be implemented.

In the first Schottky diode of the present invention, the semiconductor layer stack may have a stepped portion formed by removing a part of the second nitride semiconductor layer so as to expose the first nitride semiconductor layer, and the anode electrode may be formed so as to cover the stepped portion and to contact the block layer.

This allows the anode electrode to directly contact a two-dimensional electron gas that is produced by the first nitride semiconductor layer and the second nitride semiconductor layer, and a rising voltage of the diode can therefore be reduced. Accordingly, a Schottky diode having a low rising voltage and a significantly reduced reverse leakage current can be implemented.

In the first Schottky diode of the present invention, the block layer may be comprised of an insulating material. An inorganic material such as silicon nitride or silicon oxide, or an organic material such as polyimide or polybenzoxazole (PBO) can be used as the insulating material.

In the first Schottky diode of the present invention, the block layer may be comprised of a semiconductor. Aluminum nitride (AlN), aluminum gallium nitride (AlGaN), titanium dioxide ($TiO_2$), nickel oxide (NiO), zinc oxide (ZnO), etc. can be used as the semiconductor.

A second Schottky diode according to the present invention includes: a substrate; a semiconductor layer stack including a first nitride semiconductor layer formed over the substrate and a second nitride semiconductor layer formed on the first nitride semiconductor layer and having a wider bandgap than the first nitride semiconductor layer; and an anode electrode and a cathode electrode which are formed at an interval therebetween on the semiconductor layer stack, wherein the semiconductor layer stack has a first stepped portion and a second stepped portion which are formed by removing a part of the second nitride semiconductor layer so as to expose the first nitride semiconductor layer, the anode electrode and the cathode electrode are formed so as to cover the first stepped portion and the second stepped portion, respectively, and an overlap length of the anode electrode with a surface of the second nitride semiconductor layer is shorter than that of the cathode electrode with the surface of the second nitride semiconductor layer.

According to the second Schottky diode of the present invention, the anode electrode and the cathode electrode are formed so as to cover the first stepped portion and the second stepped portion, respectively, and the overlap length of the anode electrode with the surface of the second nitride semiconductor layer is shorter than that of the cathode electrode with the surface of the second nitride semiconductor layer. This can reduce a leakage current to the anode electrode through the surface of the second nitride semiconductor layer. Accordingly, a Schottky diode having a significantly reduced reverse leakage current and a low rising voltage can be implemented.

In the second Schottky diode of the present invention, the semiconductor layer stack may include multiple ones of the first nitride semiconductor layer and multiple ones of the second nitride semiconductor layer, and the first nitride semiconductor layers and the second nitride semiconductor layers may be alternately stacked.

In this case, a multichannel structure is formed by the first nitride semiconductor layers and the second nitride semiconductor layers, which can increase a forward current. Accordingly, a Schottky diode having low resistance and a significantly reduced reverse leakage current can be implemented.

According to the Schottky diode of the present invention, the reverse leakage current can be reduced without increasing the rising voltage.

DETAILED DESCRIPTION

First Embodiment

A first embodiment of the present invention will be described with reference to FIG. 1.

Figure 1:
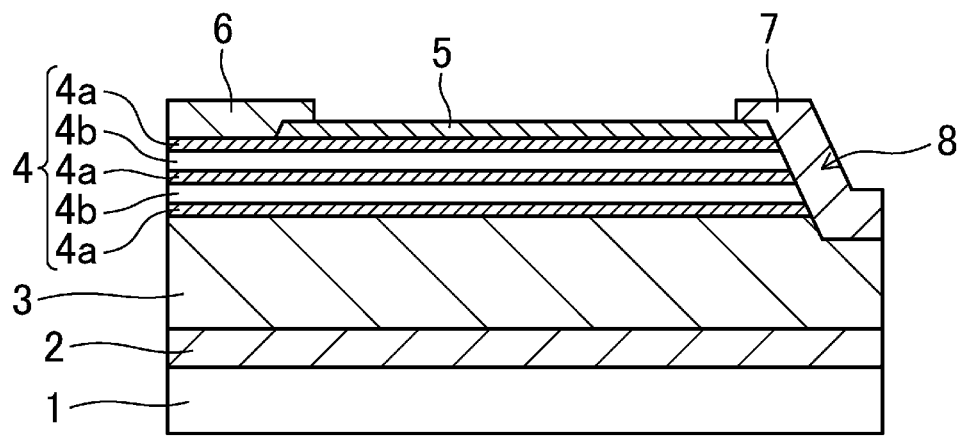
FIG. 1 is a cross-sectional view showing a Schottky diode according to a first embodiment of the present invention.

As shown in FIG. 1, a Schottky diode as a nitride semiconductor device according to a first embodiment has a semiconductor layer stack of an undoped AlN buffer layer 2 having a thickness of 200 nm, an undoped GaN layer 3 having a thickness of 2 μm, and a channel layer 4 having a multichannel structure. The undoped AlN buffer layer 2, the undoped GaN layer 3, and the channel layer 4 are sequentially formed on a substrate 1 comprised of, e.g., silicon (Si). Instead of silicon, sapphire (single crystal $Al_2O_3$), silicon carbide (SiC), gallium nitride (GaN), etc. may be used as the substrate 1.

As used herein, the term "undoped nitride semiconductor" refers to the nitride semiconductor to which no impurities determining the conductivity type have been introduced intentionally.

The channel layer 4 is formed by alternately stacking undoped AlGaN layers 4a having a thickness of 25 nm and undoped GaN layers 4b having a thickness of about 220 nm. The Al composition in the AlGaN layer 4a is 0.25. The thickness of the GaN layer 4b may be about 500 nm.

The first embodiment is characterized in that a block layer 5 having a thickness of 200 nm is formed on the surface of the semiconductor layer stack, namely on the surface of the channel layer 4. The block layer 5 is comprised of a semiconductor such as aluminum nitride (AlN) or titanium dioxide ($TiO_2$), or an insulating material such as silicon nitride (SiN) or silicon dioxide ($SiO_2$).

An anode electrode 6 is formed on one end of the semiconductor layer stack. A cathode electrode 7 is formed on the other end of the semiconductor layer stack so as to cover one side surface of a recessed region (stepped portion) 8 reaching the GaN layer 3 of the semiconductor layer stack.

The anode electrode 6 is formed so as to contact the surface of the uppermost AlGaN layer 4a by etching the block layer 5 on the semiconductor layer stack. The anode electrode 6 is comprised of, e.g., nickel (Ni) or palladium (Pd) having a thickness of 200 nm. A metal that forms a Schottky contact with electrons is used as the anode electrode 6.

The anode electrode 6 is formed so that its end on the side facing the cathode electrode 7 overlaps an end of the block layer 5.

The cathode electrode 7 is formed by, e.g., a stacked structure (Ti/Al) of titanium (Ti) having a thickness of 20 nm and aluminum (Al) having a thickness of 200 nm. The cathode electrode 7 is formed so as to form an ohmic contact with a two-dimensional electron gas layer. This can reduce contact resistance. The recessed region 8 need not necessarily be formed.

The interval between the respective opposing surfaces of the anode electrode 6 and the cathode electrode 7 is, e.g., 10 μm to 15 μm.

When forming the block layer 5 between the anode electrode 6 and the cathode electrode 7 on the semiconductor layer stack, it is important to make the barrier height between the block layer 5 and the anode electrode 6 greater than that between the anode electrode 6 and AlGaN/GaN.

The block layer 5 is not limited to the semiconductor or the insulating material described above. A semiconductor material such as N-type AlGaN, undoped AlGaN, P-type AlGaN, nickel oxide (NiO), or zinc oxide (ZnO), or an organic insulating material such as polyimide or PBO may be used as the block layer 5. The block layer 5 can block a leakage path that is formed in the interface between a passivation film and the uppermost AlGaN layer 4a of the semiconductor layer stack, whereby a reverse leakage current can be reduced.

Figure 2:
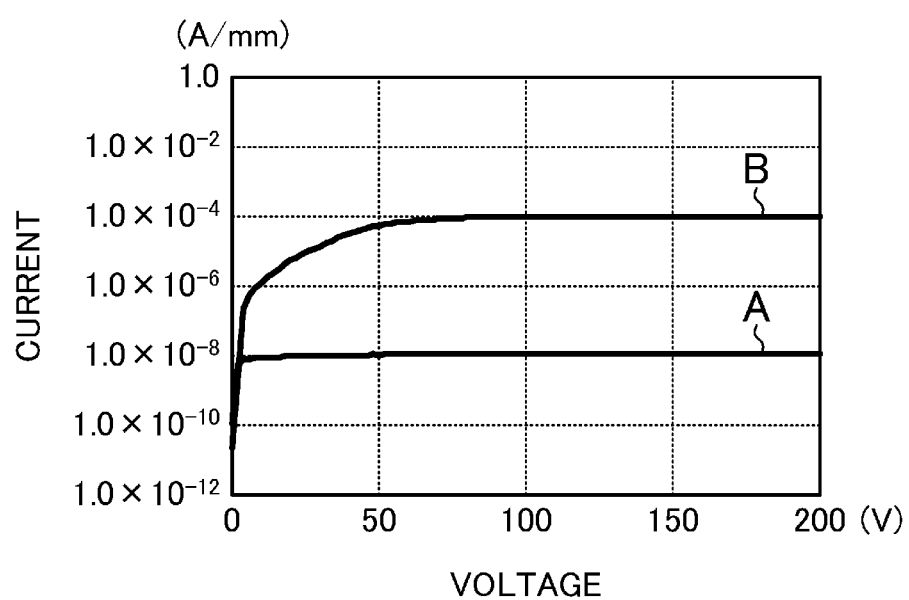
FIG. 2 is a graph showing the relation between the reverse leakage current and the applied voltage in the Schottky diode according to the first embodiment of the present invention.

FIG. 2 shows a measurement result of the reverse leakage current in the Schottky diode according to the first embodiment. In FIG. 2, the abscissa represents the applied voltage (reverse voltage (V)), and the ordinate represents the current amount per unit length (A/mm) In FIG. 2, graph A shows the amount of leakage current of the Schottky diode according to the present invention, and graph B shows the amount of leakage current of a Schottky diode having no block layer as a comparative example. The measurement was made with a passivation film of silicon nitride (SiN) etc. being formed in both the Schottky diode of the present invention and the Schottky diode of the comparative example.

As shown in FIG. 2, the leakage current of the Schottky diode of the present invention is smaller than that of the Schottky diode of the comparative example, and the difference therebetween becomes significant as the applied voltage increases. At the applied voltage of 100 V or higher, the leakage current of the Schottky diode of the present invention is about 1/100 of that of the Schottky diode of the comparative example. This result shows that the Schottky diode of the present invention can reduce the reverse leakage current.

(First Modification of First Embodiment)

Figure 3:
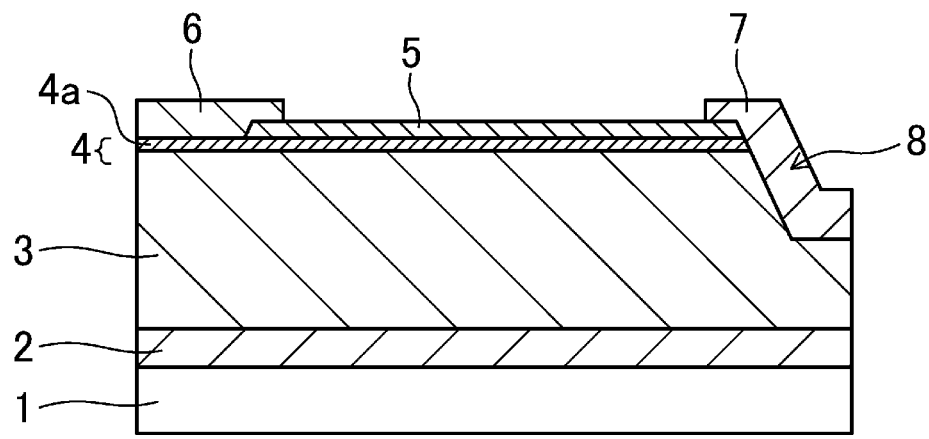
FIG. 3 is a cross-sectional view showing a Schottky diode according to a first modification of the first embodiment of the present invention.

FIG. 3 shows a first modification of the first embodiment.

The first embodiment shown in FIG. 1 is described with respect to the case where the channel layer 4 has a multichannel structure in which a plurality of AlGaN/GaN heterostructures are stacked.

The first modification shown in FIG. 3 is a Schottky diode in which a single undoped AlGaN layer 4a and a two-dimensional electron gas layer (not shown) formed near the interface between the undoped AlGaN layer 4a and the undoped GaN layer 3 are used as the channel layer 4.

Advantages similar to those of the Schottky diode shown in FIG. 1 can be obtained by the Schottky diode of the first modification.

(Second Modification of First Embodiment)

Figure 4:
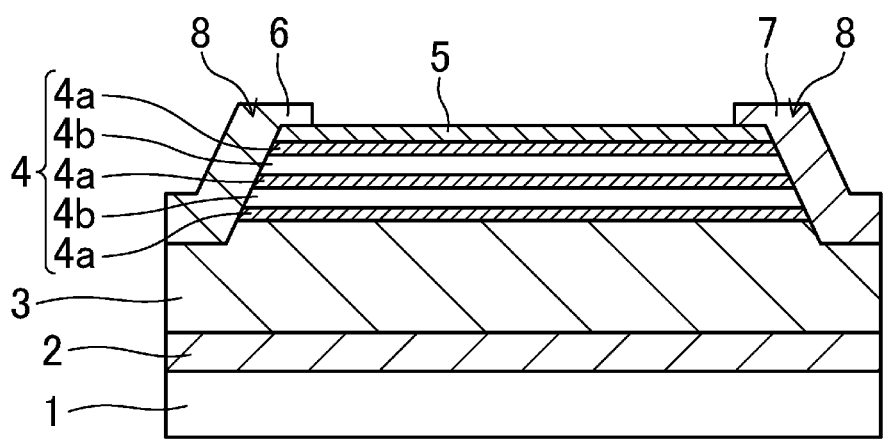
FIG. 4 is a cross-sectional view showing a Schottky diode according to a second modification of the first embodiment of the present invention.

FIG. 4 shows a second modification of the first embodiment.

As shown in FIG. 4, in the second modification, the anode electrode 6 is formed so as to cover one side surface of a recessed region 8 extending through the block layer 5 and the channel layer 4 and reaching the undoped GaN layer 3, like the cathode electrode 7.

The Schottky diode of the second modification not only has advantages similar to those of the Schottky diode shown in FIG. 1, but also can reduce a forward rising voltage because the anode electrode 6 directly contacts the channel layer 4.

Moreover, this configuration can eliminate contact between the anode electrode 6 and the surface of the uppermost AlGaN layer 4a, and thus can further reduce a reverse leakage current.

(Third Modification of First Embodiment)

Figure 5:
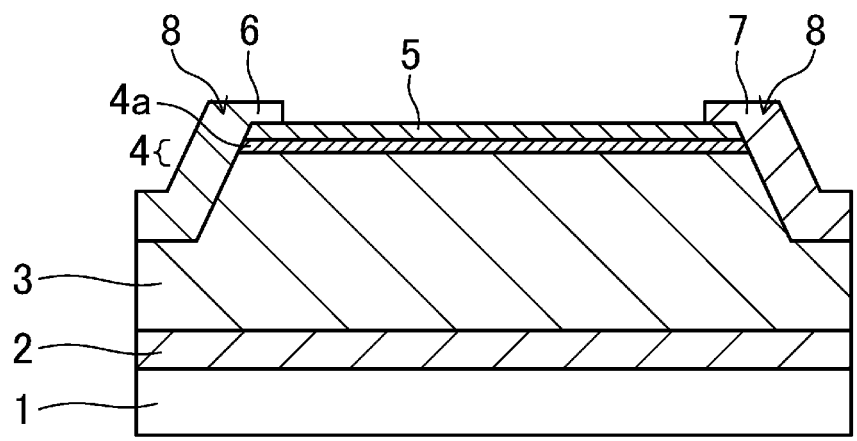
FIG. 5 is a cross-sectional view showing a Schottky diode according to a third modification of the first embodiment of the present invention.

FIG. 5 shows a third modification of the first embodiment.

As shown in FIG. 5, in the third modification, the anode electrode 6 covers one side surface of the recessed region 8 in the Schottky diode having a single AlGaN layer 4a according to the first modification shown in FIG. 3.

The Schottky diode of the third modification not only has advantages similar to those of the Schottky diode shown in FIG. 3, but also can reduce a forward rising voltage because the anode electrode 6 directly contacts the channel layer 4.

Moreover, this configuration can eliminate contact between the anode electrode 6 and the surface of the AlGaN layer 4a, and thus can further reduce a reverse leakage current.

(Fourth Modification of First Embodiment)

Figure 6:
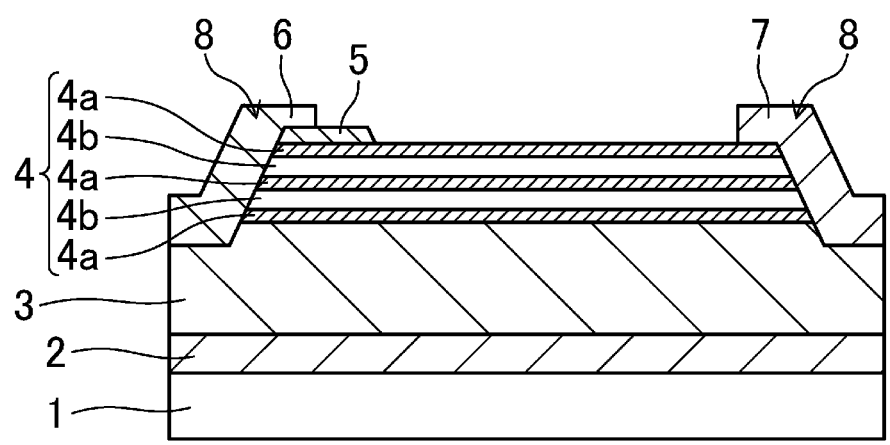
FIG. 6 is a cross-sectional view showing a Schottky diode according to a fourth modification of the first embodiment of the present invention.

FIG. 6 shows a fourth modification of the first embodiment.

As shown in FIG. 6, in the fourth modification, the block layer 5 covers a part of the uppermost AlGaN layer 4a. In this case as well, contact between the anode electrode 6 and the uppermost AlGaN layer 4a need be blocked by the block layer 5.

Advantages similar to those of the Schottky diode shown in FIG. 1 can be obtained by the Schottky diode of the fourth modification.

The recessed region 8 need not necessarily be formed in the anode electrode 6 and the cathode electrode 7.

(Fifth Modification of First Embodiment)

Figure 7:
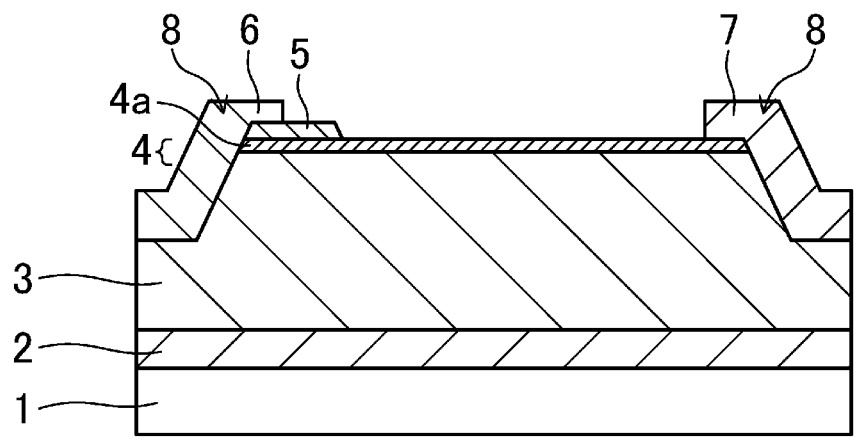
FIG. 7 is a cross-sectional view showing a Schottky diode according to a fifth modification of the first embodiment of the present invention.

FIG. 7 shows a fifth modification of the first embodiment.

As shown in FIG. 7, in the fifth modification, the block layer 5 covers a part of the AlGaN layer 4a in the third modification shown in FIG. 5. In this case as well, contact between the anode electrode 6 and the AlGaN layer 4a need be blocked by the block layer 5.

Advantages similar to those of the Schottky diode shown in FIG. 5 can be obtained by the Schottky diode of the fifth modification.

In the fourth and fifth modifications, a leakage current at the interface between the passivation film and the uppermost AlGaN layer 4a can be blocked by the block layer 5 during reverse biasing. This can reduce a reverse leakage current without degrading forward characteristics. Accordingly, a Schottky diode as an excellent nitride semiconductor device with low loss and a low reverse leakage current can be implemented.

Second Embodiment

A second embodiment of the present invention will be described with reference to FIG. 8.

Figure 8:
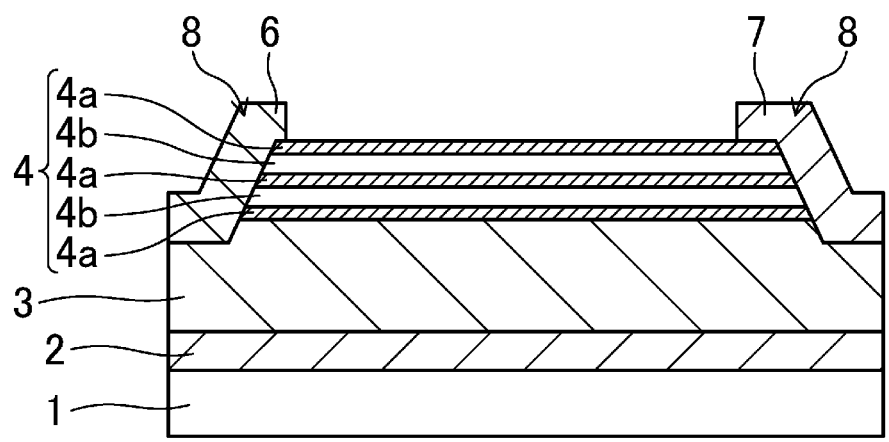
FIG. 8 is a cross-sectional view showing a Schottky diode according to a second embodiment of the present invention.

As shown in FIG. 8, a Schottky diode as a nitride semiconductor device according to the second embodiment has a semiconductor layer stack of an undoped AlN buffer layer 2 having a thickness of 200 nm, an undoped GaN layer 3 having a thickness of 2 μm, and a channel layer 4 having a multichannel structure. The undoped AlN buffer layer 2, the undoped GaN layer 3, and the channel layer 4 are sequentially formed on a substrate 1 comprised of, e.g., silicon (Si). Instead of silicon, sapphire (single crystal $Al_2O_3$), silicon carbide (SiC), gallium nitride (GaN), etc. may be used as the substrate 1.

The channel layer 4 is formed by alternately stacking undoped AlGaN layers 4a having a thickness of 25 nm and undoped GaN layers 4b having a thickness of about 220 nm. The Al composition in the AlGaN layer 4a is 0.25.

An anode electrode 6 and a cathode electrode 7 are formed on both ends of the semiconductor layer stack so as to cover one side surfaces of recessed regions (stepped portions) 8 reaching the GaN layer 3 of the semiconductor layer stack, respectively.

The anode electrode 6 is comprised of, e.g., nickel (Ni) or palladium (Pd) having a thickness of 200 nm. A metal that forms a Schottky contact with electrons is used as the anode electrode 6. This allows the anode electrode 6 to directly contact a two-dimensional electron gas, whereby a forward rising voltage can be reduced.

The cathode electrode 7 is formed by, e.g., a stacked structure (Ti/Al) of titanium (Ti) having a thickness of 20 nm and aluminum (Al) having a thickness of 200 nm. The cathode electrode 7 is formed so as to form an ohmic contact with a two-dimensional electron gas layer. This can reduce contact resistance. The interval between the respective opposing surfaces of the anode electrode 6 and the cathode electrode 7 is, e.g., 10 μm to 15 μm. The recessed region 8 need not necessarily be formed for the cathode electrode 7.

In the Schottky diode of the second embodiment, it is important that the contact area between the anode electrode 6 and the surface of the uppermost AlGaN layer 4a is smaller than that between the cathode electrode 7 and the surface of the uppermost AlGaN layer 4a.

In other words, it is important that the overlap length between the anode electrode 6 and the surface of the uppermost AlGaN layer 4a is smaller than that between the cathode electrode 7 and the surface of the uppermost AlGaN layer 4a. This can reduce a leakage current to the anode electrode 6 through the surface of the uppermost AlGaN layer 4a, and thus can reduce a reverse leakage current.

Figure 9:
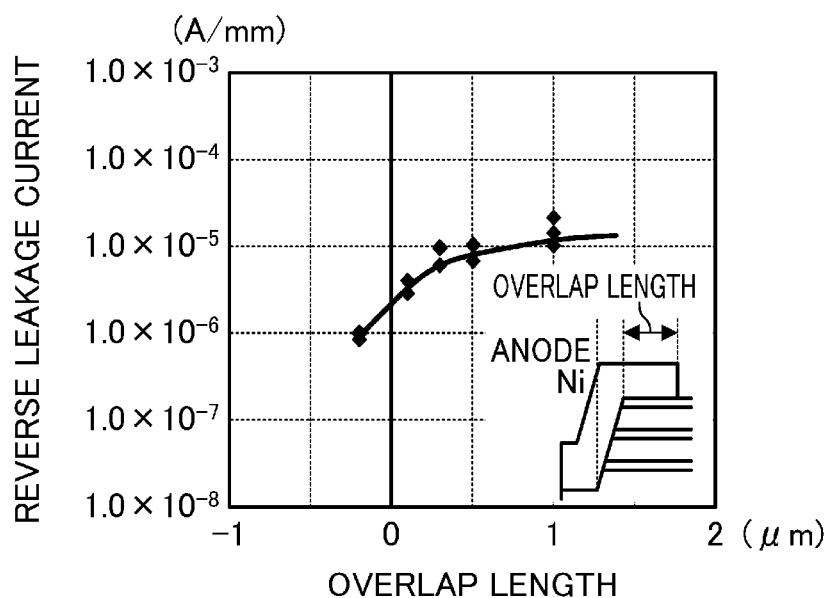
FIG. 9 is a graph showing dependency of the reverse leakage current on the overlap length between an anode electrode and the surface of an AlGaN layer in the Schottky diode according to the second embodiment of the present invention.

FIG. 9 shows the relation between the reverse leakage current and the overlap length between the anode electrode 6 and the surface of the uppermost AlGaN layer 4a in the Schottky diode of the second embodiment.

In FIG. 9, the abscissa represents the overlap length (μm) of the anode electrode, with the origin being located at the end of the uppermost AlGaN layer, and the positive direction of the abscissa being the direction along the surface of the uppermost AlGaN layer. The ordinate represents the amount of reverse leakage current (A/mm) per unit length. The voltage (reverse voltage) that is applied to the Schottky diode is 200 V. As shown in FIG. 9, the smaller the overlap length between the anode electrode and the surface of the uppermost AlGaN layer is, the smaller the amount of reverse leakage current is. This is because the leakage current to the anode electrode through the surface of the uppermost AlGaN layer is reduced as the overlap length between the anode electrode and the surface of the uppermost AlGaN layer is reduced.

As can be seen from FIG. 9, it is preferable that the overlap amount of the anode electrode with the AlGaN layer be as small as possible in order to reduce the leakage current. For example, the optimal overlap amount of the anode electrode is 200 nm or less, and more preferably 100 nm or less. It is difficult to implement the overlap length of 0 for process reasons such as mask misalignment. Accordingly, it is preferable that the overlap amount of the anode electrode with the AlGaN layer be 20 nm or more. That is, an optimal overlap amount of the anode electrode is in the range of 20 nm to 200 nm, both inclusive, and more preferably in the range of 20 nm to 100 nm, both inclusive.

The overlap amount of the cathode electrode with the uppermost AlGaN layer is in the range of 0.5 μm to 1 μm, both inclusive. That is, the leakage current can be reduced in the case where the overlap length between the anode electrode and the surface of the uppermost AlGaN layer is smaller than that between the cathode electrode and the surface of the uppermost AlGaN layer.

The leakage current can be reduced not only in the case where the overlap length between the anode electrode and the surface of the uppermost AlGaN layer is smaller than that between the cathode electrode and the surface of the uppermost AlGaN layer, but also in the case where the contact area between the anode electrode and the surface of the uppermost AlGaN layer is smaller than that between the cathode electrode and the surface of the uppermost AlGaN layer.

(Modification of Second Embodiment)

Figure 10:
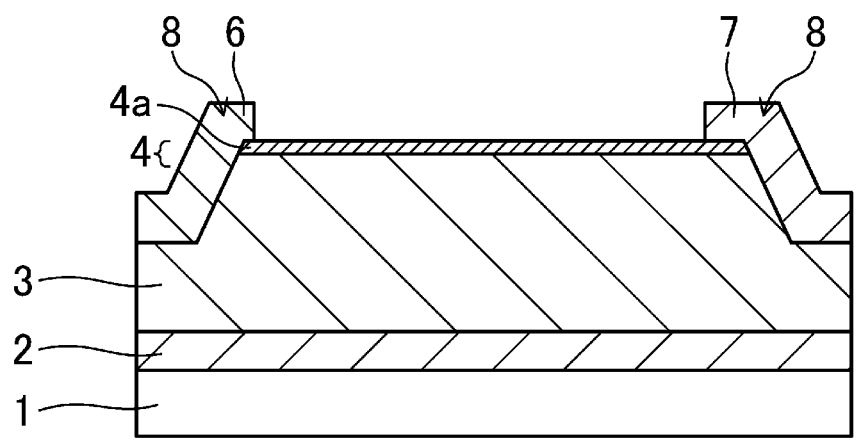
FIG. 10 is a cross-sectional view showing a Schottky diode according to a modification of the second embodiment of the present invention.

FIG. 10 shows a modification of the second embodiment.

The second embodiment shown in FIG. 8 is described with respect to the case where the channel layer 4 has a multichannel structure in which a plurality of AlGaN/GaN heterostructures are stacked.

The modification shown in FIG. 10 is a Schottky diode in which a single undoped AlGaN layer 4a and a two-dimensional electron gas layer (not shown) formed near the interface between the undoped AlGaN layer 4a and the undoped GaN layer 3 are used as the channel layer 4.

Advantages similar to those of the Schottky diode shown in FIG. 8 can be obtained by the Schottky diode of this modification.

A Schottky metal forming the anode electrode 6 preferably includes at least one of nickel (Ni), palladium (Pd), and gold (Au).

The second embodiment and the modification thereof can reduce the leakage current to the anode electrode through the surface of the AlGaN layer, and thus can reduce the reverse leakage current without degrading forward characteristics. Accordingly, a Schottky diode as an excellent nitride semiconductor device with low loss and a low reverse leakage current can be implemented.

The Schottky diode according to the present invention can implement reduction in reverse leakage current without increasing a rising voltage, and is useful as power devices etc. that are used in power supply circuits of consumer equipment such as a television set, etc.

What is claimed is:

1. A Schottky diode, comprising:
  a substrate;
  a semiconductor layer stack including a first nitride semiconductor layer formed over the substrate and a second nitride semiconductor layer formed on the first nitride semiconductor layer and having a wider bandgap than the first nitride semiconductor layer;
  an anode electrode and a cathode electrode which are formed at an interval therebetween on the semiconductor layer stack; and
  a block layer formed in a region between the anode electrode and the cathode electrode so as to contact the second nitride semiconductor layer, wherein:
  a channel is formed at an interface between the first nitride semiconductor and the second nitride semiconductor,
  the anode electrode forms a Schottky contact with the channel, the cathode electrode forms an ohmic contact with the channel, a part of the anode electrode is formed on the block layer so as not to contact an upper surface of the second nitride semiconductor layer, and a potential barrier height between the anode electrode and the block layer is greater than a potential barrier height between the anode electrode and the second nitride semiconductor layer.

2. The Schottky diode of claim 1, wherein the semiconductor layer stack includes multiple first nitride semiconductor layers and multiple second nitride semiconductor layers, and the first nitride semiconductor layers and the second nitride semiconductor layers are alternately stacked.

3. The Schottky diode of claim 1, wherein the semiconductor layer stack has a stepped portion formed by removing a part of the second nitride semiconductor layer so as to expose the first nitride semiconductor layer, and the anode electrode is formed so as to cover the stepped portion and to contact the block layer.

4. The Schottky diode of claim 1, wherein the block layer is comprised of an insulating material.

5. The Schottky diode of claim 1, wherein the block layer is comprised of a semiconductor.

* * * * *